US009111822B2

(12) United States Patent
Speier (10) Patent No.: US 9,111,822 B2
(45) Date of Patent: Aug. 18, 2015

(54) THERMALLY AND ELECTRICALLY CONDUCTIVE APPARATUS (75) Inventor: Ingo Speier, Saanichton (CA)

(73) Assignee: KONINKLIJKE PHILIPS N. V., Eindhoven (NL)

( * ) Notice: Subject to any disclaimer, the term of this patent is extended or adjusted under 35 U.S.C. 154(b) by 1424 days.

(21) Appl. No.: 10/567,179

(22) PCT Filed: Jan. 5, 2006

(86) PCT No.: PCT/CA2006/000011
§ 371 (c)(1),
(2), (4) Date: May 22, 2008

(87) PCT Pub. No.: WO2006/072176
PCT Pub. Date: Jul. 13, 2006

(65) Prior Publication Data
US 2008/0239675 A1 Oct. 2, 2008

Related U.S. Application Data

(60) Provisional application No. 60/641,711, filed on Jan. 5, 2005.

(51) Int. Cl.
*H05K 7/20* (2006.01)
*H01L 23/14* (2006.01)
(Continued)

(52) U.S. Cl.
CPC .............. *H01L 23/142* (2013.01); *H01L 23/13* (2013.01); *H01L 23/367* (2013.01); *F21V 29/006* (2013.01);
(Continued)

(58) Field of Classification Search
USPC ........................ 361/676–678, 679.46–679.54, 361/688–722, 752, 760–767, 831, 792–796
See application file for complete search history.

(56) References Cited

U.S. PATENT DOCUMENTS 4,106,188 A 8/1978 Sekhon
4,322,737 A 3/1982 Sliwa, Jr.
(Continued)

FOREIGN PATENT DOCUMENTS

EP 0 529 837 A1 3/1993
WO WO 9916136 A1 4/1999
(Continued)

OTHER PUBLICATIONS

Pamula, V.K., and K. Chakrabarty, "Cooling of Integrated Circuits Using Droplet-Based Microfluidics," Proc. ACM Great Lakes Symposium on VLSI, Washington, D.C., 2003. pp. 84-87.
(Continued)

*Primary Examiner* — Courtney Smith
(74) *Attorney, Agent, or Firm* — Yuliya Mathis (57) ABSTRACT

The present invention provides a thermally and electrically conductive apparatus that can provide both thermal conductivity and electrical conductivity for one or more electronic devices connected thereto. The apparatus comprises a thermally conductive element that is in thermal contact with one or more electronic devices and optionally in contact with a heat dissipation system. A portion of the thermally conductive element is surrounded by a multilayer coating system comprising two or more layers. The multilayer coating system includes alternating electrically insulating and electrically conductive layers in order to provide paths for the supply of electric current to the one or more electronic devices. A conductive layer of the multilayer coating system may be selectively patterned to connect to one or more electronic devices. In this manner, the combination of an electronic circuit carrier and a thermally conductive element can unify thermal conductivity with the provision of power and/or communication into a single integrated unit for use with electronic devices.

15 Claims, 10 Drawing Sheets

(51) Int. Cl.
  *H01L 23/13* (2006.01)
  *H01L 23/367* (2006.01)
  *H01L 25/075* (2006.01)
  *H01L 33/64* (2010.01)
  *F21V 29/00* (2015.01)

(52) U.S. Cl.
  CPC ........... *H01L 25/0753* (2013.01); *H01L 33/647* (2013.01); *H01L 2224/48227* (2013.01); *H01L 2924/12044* (2013.01)

(56) References Cited

U.S. PATENT DOCUMENTS

| | | | |
|---|---|---|---|
| 5,216,580 | A | 6/1993 | Davidson |
| 5,903,583 | A * | 5/1999 | Ullman et al. .................. 372/35 |
| 5,982,630 | A * | 11/1999 | Bhatia .......................... 361/767 |
| 6,150,716 | A | 11/2000 | MacQuarrie |
| 6,159,764 | A | 12/2000 | Kinsman |
| 6,194,246 | B1 * | 2/2001 | Anderson et al. ............. 438/106 |
| 6,327,149 | B1 | 12/2001 | Goenka |
| 6,540,525 | B1 | 4/2003 | Li |
| 6,573,536 | B1 | 6/2003 | Dry |
| 6,606,251 | B1 | 8/2003 | Kenny, Jr. |
| 6,661,544 | B1 | 12/2003 | Okino |
| 6,678,168 | B2 | 1/2004 | Kenny, Jr. |
| 6,976,769 | B2 | 12/2005 | McCullough |
| 6,991,356 | B2 | 1/2006 | Tsimerman |
| 7,066,733 | B2 * | 6/2006 | Logan et al. .................... 433/29 |
| 7,095,053 | B2 * | 8/2006 | Mazzochette et al. .......... 257/81 |
| 2001/0046652 | A1 | 11/2001 | Ostler |
| 2002/0054480 | A1 * | 5/2002 | Jitaru ............................. 361/704 |
| 2002/0163781 | A1 * | 11/2002 | Bartola et al. ................. 361/699 |
| 2003/0020156 | A1 * | 1/2003 | Farquhar et al. .............. 257/701 |
| 2003/0133275 | A1 * | 7/2003 | Miyake et al. ................. 361/761 |
| 2003/0179548 | A1 | 9/2003 | Becker |
| 2004/0040695 | A1 | 3/2004 | Chesser |
| 2004/0120162 | A1 | 6/2004 | Tsimerman |
| 2004/0141326 | A1 | 7/2004 | Dry |
| 2004/0163797 | A1 | 8/2004 | Cosley et al. |
| 2004/0213016 | A1 * | 10/2004 | Rice ............................... 362/547 |
| 2005/0189557 | A1 * | 9/2005 | Mazzochette et al. ........ 257/100 |
| 2005/0231983 | A1 | 10/2005 | Dahm |
| 2006/0001384 | A1 * | 1/2006 | Tain et al. ...................... 315/246 |
| 2006/0261470 | A1 | 11/2006 | Schick ........................... 257/718 |
| 2007/0297178 | A1 * | 12/2007 | Tain et al. ...................... 362/294 |

FOREIGN PATENT DOCUMENTS

| | | |
|---|---|---|
| WO | WO 03081127 A2 | 10/2003 |
| WO | WO 2004007241 A2 | 1/2004 |
| WO | WO 2004011848 A2 | 2/2004 |
| WO | WO 2004038759 A2 | 5/2004 |
| WO | WO 2004056288 A1 | 7/2004 |

OTHER PUBLICATIONS

"T-preg 1KA Dielectric for LED Lighting Applications," Thermagon, Inc., a Division of Laird Technologies, Cleveland, Ohio, Aug. 16, 2004, 2-page brochure.

* cited by examiner

THERMALLY AND ELECTRICALLY CONDUCTIVE APPARATUS

FIELD OF THE INVENTION

The present invention pertains to the field of electronic devices and in particular to thermally conductive circuit carriers for use with electronic devices.

BACKGROUND

Effective thermal management is a key factor in ensuring stable electronic device performance over a long lifetime. For electronic devices, a high operating temperature can reduce the lifetime of the devices and their efficacy. In addition, for optoelectronic devices, for example light-emitting diodes (LEDs), the junction temperature thereof can also influence the wavelength of the emitted light. Therefore, effective thermal management of these electronic devices is required.

Adequate cooling may not be achieved by mounting high-powered electronic components to standard laminate boards, for example FR4 boards. This form of board typically does not provide sufficient thermal conductivity to remove heat from high-powered components in order that they can operate within a desired temperature range. As a result, secondary cooling systems for example, heatsinks or coldplates are often used in conjunction with these laminate boards. While adding a secondary cooling system provides an improvement in thermal management, the thickness of a laminate board can provide a barrier to thermal conductivity.

Incorporating thermal management into printed circuit boards (PCBs) has enhanced the thermal flow between the heat source and the cooling system, resulting in improved thermal management. PCBs may include thermal vias comprising thermally conductive materials such as copper or aluminium that are placed in direct thermal contact with heat-producing components. In metal-core PCBs (MCPCB), for example, the core of the board comprises a thermally conductive metal. An MCPCB can be effective because it can be provide close proximity between heat-producing electrical components and the thermally conductive material, however, the thermal properties of such modified PCB boards are typically insufficient for many of today's applications. Hence, more advanced thermal management systems for use with high-powered electronic components have been developed in order to meet this need.

For example, heat pipes, thermosyphons and other two-phase cooling devices have been designed to remove heat from high-power electronic components in an efficient manner. In these devices, heat is transported away from the heat source by means of a heat conducting fluid inside the device. This device typically has two ends, namely an evaporator end and a condenser end. At the evaporator end the fluid evaporates upon absorption of the heat, travels to the condenser end, and condenses upon release of the heat, wherein this fluid may be water or some other evaporable fluid. Heat pipes and thermosyphons are passive systems, thereby requiring no drive circuitry or moving parts to enable their operation. These devices have proven to be effective in moving heat away from high-powered electronic components, particularly when paired with a secondary cooling system. However, these devices are typically designed to be in contact with metal-core PCBs or other substrates that, while being thermally conductive, typically do not enable thermal management as effectively as the heat pipes. As such, benefits of a heat pipe are typically not optimized, as there is a thickness of a less thermally conductive substrate between the heat-producing element and the heat pipe.

A number of literature references disclose the use of thermally conductive devices for use with a heat sink apparatus. For example, U.S. Pat. No. 4,106,188 discloses a package that uses direct cooling of high power transistors by incorporating the components into a heat pipe. The devices are mounted on the inside wall of a heat pipe such that they become part of the wall structure. Electronic circuitry is included, however it does not allow for complete functionality of the devices. In addition, the invention does not discuss how to effectively thermally manage mounted optoelectronic devices for example LEDs or lasers, which are mounted on an exterior surface.

U.S. Pat. No. 6,573,536 and United States Patent Application Publication No. 2004/0141326 disclose a light source comprising LEDs mounted to the side of a hollow thermally conductive tube that uses air as the cooling medium wherein the air flows in one direction inside the tube. Electrical connections to the LEDs can be achieved through conductive paths disposed on an electrically insulating layer. These conductive paths can be provided by means of one or more flexible printed circuits that are placed on the surface of the tube. The means of placing the flexible printed circuits on the surface of the tube however, is not disclosed. Specifically in this prior art the thermal management design and the electrical subsystem are conceived as two separate components and not as one integrated system.

International Publication No. WO 03/081127 discloses a Cooled Light Emitting Apparatus that utilizes a combination of heat pipe and thermoelectric coolers to dissipate heat created by high power LEDs. The LEDs are mounted on a heat spreader plate, which is in thermal contact with a thermoelectric cooler, and which passes the heat to a heat pipe or other heat exchange system. For this system, the thermoelectric cooler requires a current passed through it in order to activate the cooling function, which can result in addition operational power of this system.

United States Patent Application Publication No. 2001/0046652 discloses a Light Emitting Diode Light Source for Dental Curing. This publication discloses simple circuitry in the form of one electrically conducting layer and one electrically insulating layer that are deposited on one side of a thermally conductive substrate possessing machined trenches that are used to create simple circuitry. The substrate is in contact with a thermally conductive member such as a heat pipe. The LEDs are mounted directly to the substrate, assuming it to be electrically conductive. Control electronics and LEDs are separated and no reference is made to mix accompanying electronics with high-power devices on a single substrate.

International Publication Nos. WO 2004/038759 and WO 2004/011848 disclose a method and apparatus for using light emitting diodes for curing composites and various solid-state lighting applications. In this invention, one or more LEDs are mounted either directly on a heat pipe or on a substrate that is in thermal contact with the heat pipe. The invention discloses integrating circuitry through substrate patterning and through the utilization of printed circuit boards in close contact with the heat pipe.

United States Patent Application Publication No. 2004/0120162 discloses a light source that may be used as part of a dental curing lamp. It discloses LED dies that are placed on a substrate that is in contact with a heat exchanger. However, there is no discussion of the integration of electronic circuitry necessary to drive the LEDs.

U.S. Pat. No. 5,216,580 discloses an optimized integral heat pipe and electronic circuit module arrangement. This patent discloses a ceramic substrate carrying electronic components on one side and metallization and a wick structure on the opposing side. The heat pipe comprises an attached matching structure containing a vapour chamber filled with evaporative fluid. The substrate material of this invention is limited to ceramics, and this invention is also limited to the placement of specific electronic devices on such a heat pipe.

While there are many electronic device substrates that incorporate highly thermally conductive systems, the design of such substrates is essentially planar which limits the number of components per useable substrate area that can be thermally managed. Therefore, there is a need for a new apparatus that unifies thermal conductivity and electrical conductivity with an added possibility for enhanced package densities.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a thermally and electrically conductive apparatus. In accordance with one aspect of the present invention there is provided a thermally and electrically conductive apparatus to which one or more electronic devices can be operatively connected, the apparatus comprising: a thermally conductive element in thermal contact with the one or more electronic devices; and a multilayer coating system including two or more layers, said two or more layers being a sequence of electrically insulating and electrically conductive layers integrally formed on a portion of the thermally conductive element, said electrically conductive layers providing one or more paths for supplying electric current to the one or more electronic devices.

BRIEF DESCRIPTION OF THE FIGURES

FIG. 2b illustrates a top view of the embodiment according to FIG. 2a.

FIG. 3b illustrates a top view of the embodiment according to FIG. 3a.

FIG. 4b illustrates a top view of the embodiment according to FIG. 4a.

FIG. 5b illustrates a top view of the embodiment according to FIG. 5a.

FIG. 6b illustrates a top view of the embodiment according to FIG. 6a.

DETAILED DESCRIPTION OF THE INVENTION

Definitions

The term "electronic device" is used to define any device wherein its level of operation is dependent on the current being supplied thereto. An electronic device comprises light-emitting elements, laser diodes and any other devices requiring current regulation as would be readily understood by a worker skilled in the art.

The term "light-emitting element" is used to define any device that emits radiation in any region or combination of regions of the electromagnetic spectrum for example, the visible region, infrared and/or ultraviolet region, when activated by applying a potential difference across it or passing a current through it, for example. Therefore a light-emitting element can have monochromatic, quasi-monochromatic polychromatic or broadband spectral emission characteristics. Examples of light-emitting elements include semiconductor, organic, or polymer/polymeric light-emitting diodes, optically pumped phosphor coated light-emitting diodes, optically pumped nano-crystal light-emitting diodes or any other similar light-emitting devices as would be readily understood by a worker skilled in the art. Furthermore, the term light-emitting element is used to define the specific device that emits the radiation, for example a LED die, and can equally be used to define a combination of the specific device that emits the radiation together with a housing or package within which the specific device or devices are placed.

As used herein, the term "about" refers to a +/−10% variation from the nominal value. It is to be understood that such a variation is always included in any given value provided herein, whether or not it is specifically referred to.

Unless defined otherwise, all technical and scientific terms used herein have the same meaning as commonly understood by someone of ordinary skill in the art to which this invention belongs.

The present invention provides a thermally and electrically conductive apparatus that can provide both thermal conductivity and electrical conductivity for one or more electronic devices connected thereto. The apparatus comprises a thermally conductive element that is in thermal contact with one or more electronic devices and optionally in contact with a support structure, which can comprise a heat dissipation system. A portion of the thermally conductive element is surrounded by a multilayer coating system comprising two or more layers. The multilayer coating system includes a sequence of electrically insulating and electrically conductive layers in order to provide paths for the supply of electric current to the one or more electronic devices. A conductive layer of the multilayer coating system may be selectively patterned to connect to one or more electronic devices. In this manner, the combination of an electronic circuit carrier in the form of a multilayer coating system and a thermally conductive element can unify thermal conductivity with the provision of power and/or communication into a single integrated unit for use with electronic devices.

The apparatus according to the present invention can be compact in design and can achieve effective thermal management. It can also be implemented in a modular format. Circuitry and other electronic devices can be placed on one or more of the layers of the multilayer coating system such that heat can additionally be transported away therefrom, thereby enabling the provision of thermal management to an entire system, for example. The provision of circuit paths to the multilayer coating system can reduce the need for external circuit boards for association with the apparatus, thereby resulting in a reduced size of the apparatus and allowing for increased density of these apparatuses in a prescribed area. In one embodiment the thermally and electrically conductive apparatus can provide an electronic circuit carrier, a support structure for one or more electronic devices, a thermal connector to a heat dissipation system and a mating electrical connection to a support structure that can provide power and/or communication to the electronic devices.

The present invention applies efficient heat removal technology implemented in active or passive thermally conductive elements, for example heat pipes and thermosyphons, forced convection cooled systems including fluid cooled cold plates or micro channel coolers, or thermoelectric cooling with the an integrated electrically conductive multilayer coating system. High-power electronic devices and optoelectronic devices, for example high flux light-emitting devices, can be placed on the thermally conductive element that can also carry the required circuit traces and possibly further components required for the operation of the electronic devices. The reliability of the electronic devices can be improved as the thermally conductive element can reduce the thermal resistance of the apparatus and thereby provide lower electronic device operating temperature conditions. The integration of electronic circuitry with the thermally conductive element can provide a modular design such that the unit can be connected to a supporting structure that can supply power, communication and access to a heat dissipation system.

Figure 1A:
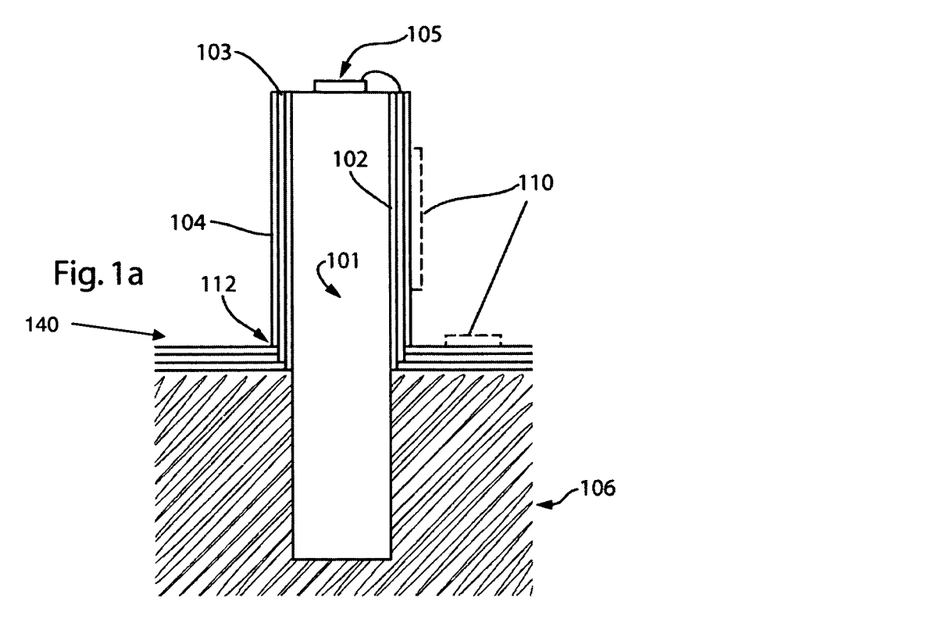
FIG. 1a illustrates a cross-sectional view of an apparatus according to one embodiment of the present invention, wherein an electronic device is mounted directly on the thermally conductive element.
Figure 1B:
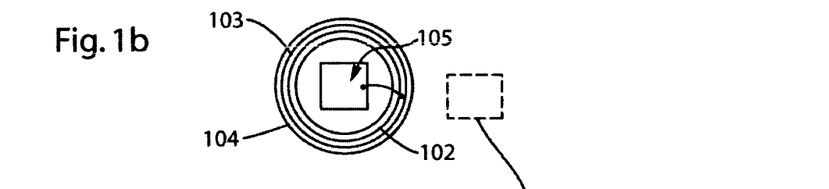
FIG. 1b illustrates a top view of the embodiment according to FIG. 1a wherein the thermally conductive element has a circular cross section.
Figure 1C:
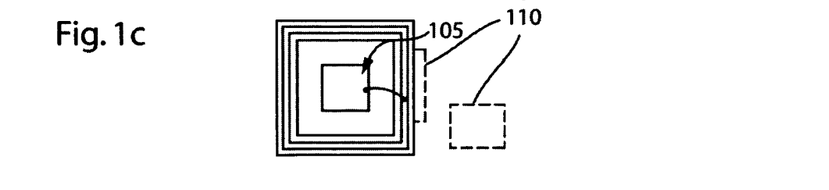
FIG. 1c illustrates a top view of the embodiment according to FIG. 1a wherein the thermally conductive element has a square cross section.

One embodiment of the present invention is illustrated in FIG. 1a. A thermally conductive element 101 is surrounded by a multilayer coating system of alternating electrically conductive 103 and electrically insulating layers 102 and 104. The numbers and sequences of layers of the multilayer coating system can be different from the ones illustrated and can be dependent on the desired functionality of the multilayer coating system. One or more electronic devices 105 are in contact with the thermally conductive element and further electronic devices 110 may be attached to the multilayer coating system. The thermally and electrically conductive apparatus can optionally be coupled to a support structure 106, which can comprise for example a heat dissipation system. The support structure can comprise a circuit carrier 140 which can matingly connect at connection 112 with the multilayer coating of the thermally and electrically conductive apparatus.

Thermally Conductive Element

Heat generated by electronic devices that are in thermal contact with a thermally conductive element can be removed and transferred by the thermally conductive element. In one embodiment, the thermally conductive element is connected to a heat dissipation system.

The thermally conductive element may be formed in a number of different shapes for example a pin, a planar element, a curved element, a cylinder, paraboloid, ellipsoid or any other desired shape. In addition, the thermally conductive element can have a variety of cross-sectional shapes for example circular, parabolic, elliptical, prismatic or rectangular. FIGS. 1b, 1c, 7a and 8 illustrate various views, of example shapes of thermally conductive elements.

Furthermore, in different embodiments, a thermally conductive element may be selected as one of or a combination of heat pipes, thermosyphons, micro channel and macro channel coolers, or other passive thermal devices, for example. Alternately, the thermally conductive element can be configured as an active cooling device including a thermoelectric cooler, thermionic cooler and a forced convection cooler, for example.

The thermally conductive element can be made of an electrically conductive or an electrically insulating material. For example, a thermally conductive element can be made of copper, a copper alloy, aluminium or a different metal, a ceramic material, a polymer material, or other material provided that the selected material is thermally conductive. When associating high-power electronic devices with a thermally conductive element it can be advantageous to match the thermal expansion coefficient of the material from which the thermally conductive element is formed to that which one or more of the electronic devices are manufactured. For example, for an electronic device like a LED die, a material for the thermally conductive element that can satisfy this requirement is a combination of copper and tungsten, Cu/W.

Multilayer Coating System

A multilayer coating system is formed on the thermally conductive element, wherein the system comprises two or more layers and the two or more layers forming a sequence of electrically conductive and electrically insulating layers, wherein all layers provide a desired level of thermal conductivity. For example, an appropriate electrically conductive layer can be formed from copper, aluminium or other electrically conductive material. An appropriate electrically insulating layer can be formed from a suitable polymer, for example T-preg 1KA Dielectric material manufactured by Thermagon, a ceramic or other electrically insulating material known to a worker skilled in the art. One or more of the layers of the multilayer coating system may be patterned to provide electrical circuit traces, solder pads, vias or other means to provide electronic connection between one or more electronic devices and the appropriate electrically conductive layer. For example, through the provision of circuit traces in or on the one or more of the layers of the multilayer coating system, electronic devices can be controlled individually or in one or more groups. Furthermore, one or more layers may be patterned to mount additional electronic components, or may provide an electrical interface to external power and control, for example. As illustrated in FIG. 2b, each electronic device connected to the thermally conductive element, is electrically connected to an individual circuit trace 220 thereby enabling individual control of each electronic device.

In one embodiment of the present invention, the thermally conductive element is a tubular heat pipe and the multilayer coating system may be formed only on the end of the heat pipe. Optionally, the multilayer coating system may be formed at the end portions or all or part of the sidewall sections of the thermally conductive element. Furthermore, the thermally conductive element can be sheathed by a multilayer coating system. Embodiments of these configurations are illustrated in FIGS. 1a, 2a, 3a and 4a.

The electrically insulating layers can be formed from materials including silicon oxides, silicon nitrides, alumina, CVD diamond or other materials as would be readily understood by a worker skilled in the art. Optionally, ceramic slurries for example those suitable for the fabrication of metal-core PCBs may also be used to form the electrically insulating layers. The thickness of the one or more electrically insulating layers in the multilayer coating system can be designed in order that their thermal resistance is within a desired range, thereby potentially minimising their effect on the thermal transmission between an electronic device and the thermally conductive element.

The layers forming the multilayer coating system can be deposited on a thermally conductive element using a variety of deposition techniques, for example chemical vapour deposition (CVD), physical vapour deposition (PVD), atomic layer deposition (ALD), dip coating, electroplating, screen printing, or other techniques of thin-layer deposition known in the art.

Figure 2A:
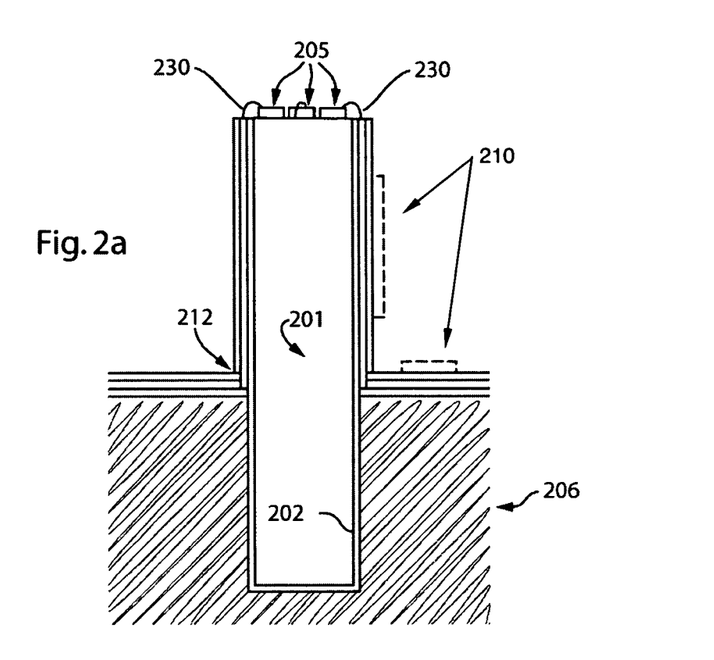
FIG. 2a illustrates a cross sectional view of a thermally and electrically conductive apparatus according to one embodiment of the present invention, wherein multiple electronic devices are mounted directly on the thermally conductive element.
Figure 2B:
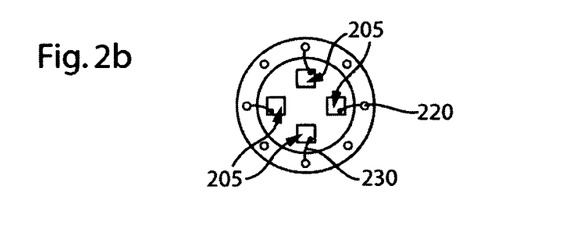
Figure 3A:
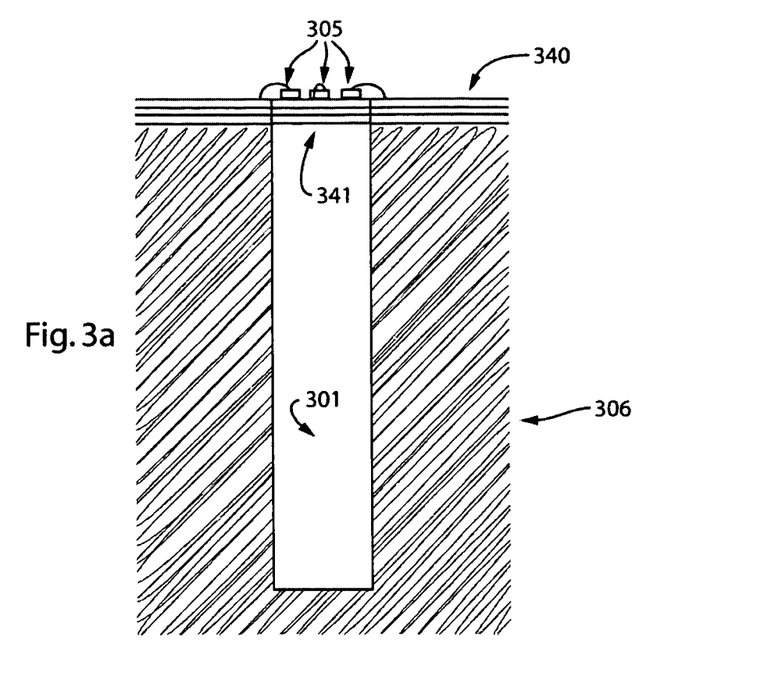
FIG. 3a illustrates a cross sectional view of a thermally and electrically conductive apparatus according to one embodiment of the present invention, wherein the thermally conductive element is embedded in a support structure for example a heat dissipation system.
Figure 4A:
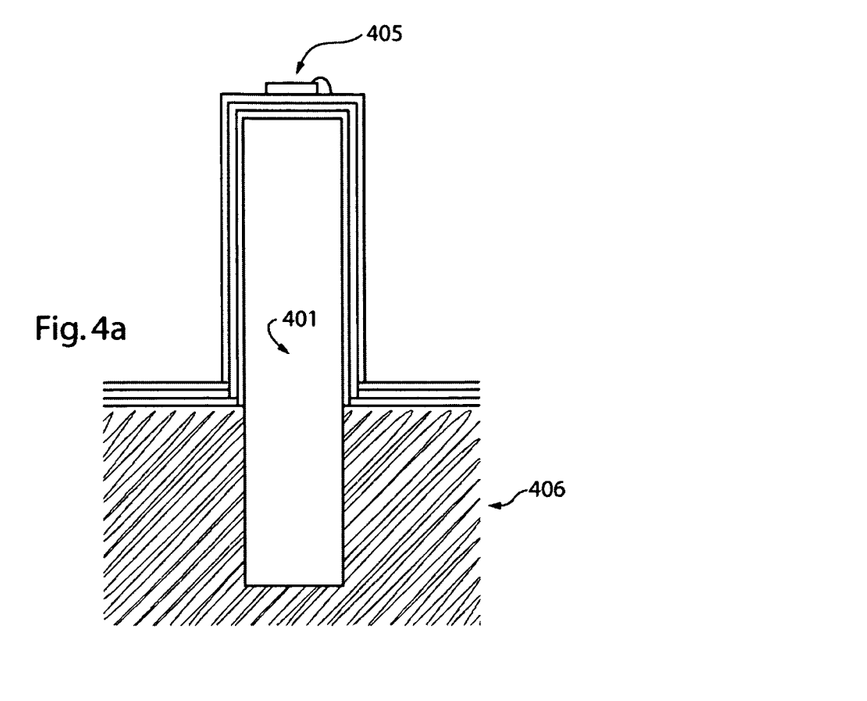
FIG. 4a illustrates a cross sectional view of a thermally and electrically conductive apparatus according to another embodiment of the present invention, wherein an electronic device is mounted on the multilayer coating system of the apparatus.
Figure 4B:
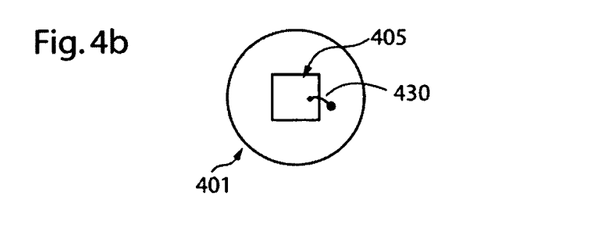
Figure 5A:
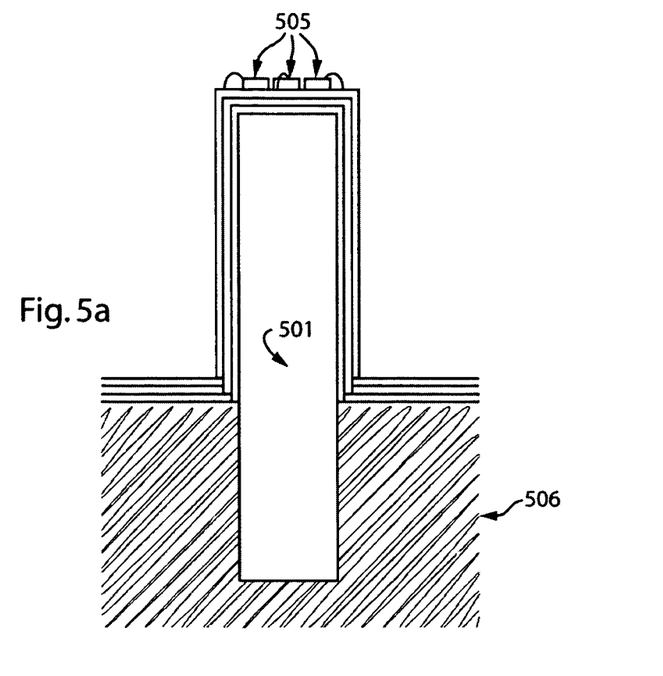
FIG. 5a illustrates a cross sectional view of a thermally and electrically conductive apparatus according to another embodiment of the present invention, wherein multiple electronic devices are mounted on the multilayer coating system of the apparatus.
Figure 6A:
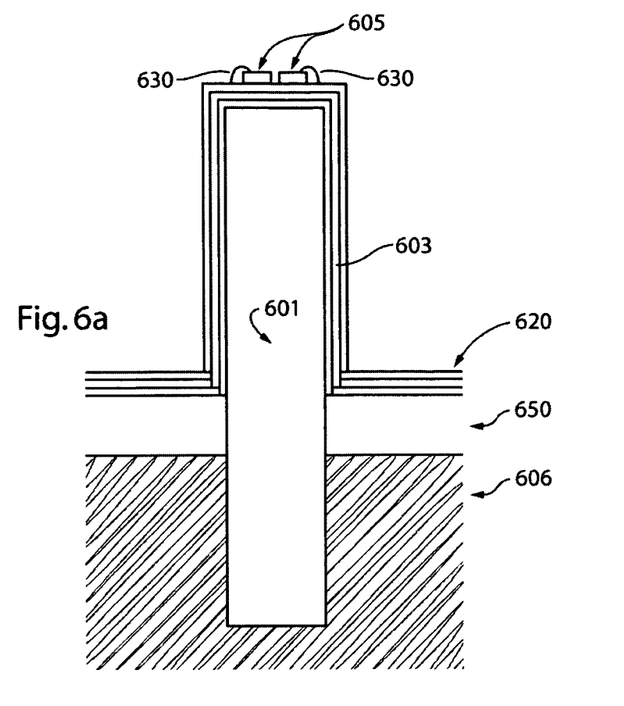
FIG. 6a illustrates a cross sectional view of a thermally and electrically conductive apparatus according to another embodiment of the present invention, wherein a separation layer is located between the support structure for example a heat dissipation system and the layered structure thereabove.

In a number of different embodiments of the present invention, the multilayer coating system provides direct access to one end of the thermally conductive element, for example as illustrated in FIGS. 1a, 2a and 3a. In other embodiments of the invention, the multilayer coating system fully surrounds one end of the thermally conductive element as illustrated in FIGS. 4a, 5a and 6a. The multilayer coating system can be configured in order that it has a desired minimal thermal resistance to heat transfer between the one or more electronic devices and the thermally conductive element.

Interface

In one embodiment, the thermally and electrically conductive apparatus can be interconnected to a support structure, which can comprise a heat dissipation system for example. The thermally and electrically conductive apparatus can have mechanical indexing features to provide a reliable and consistent electrical connection to the support structure. For example, electrical circuit traces can be patterned such that upon insertion of the apparatus into a suitable support structure, the indexing features ensure that the exposed traces are in contact with corresponding traces on the support structure that supplies power and/or communication signals to the apparatus. A form of this indexing of the thermally and electrically conductive apparatus is illustrated at connection 112 or 212 in FIGS. 1a and 2a respectively, wherein the multilayer coatings are appropriately formed in order to interconnect with desired layers on the support structure in a mating manner, for example.

In one embodiment, the thermally and electrically conductive apparatus is modularly attachable to a support structure, wherein the support structure can comprise a heat dissipation system. In one embodiment, the support structure can further comprise a circuit board with an electrical interface to the thermally and electrically conductive apparatus, for example. In addition, the thermally and electrically conductive apparatus can be clamped, screwed, bolted, or snapped, and may include keys or indexing points such that it can be inserted into or detached from the support structure in a predetermined and repeatable fashion. In another embodiment, the thermally and electrically conductive apparatus can be permanently glue bonded, soldered, or welded to a support structure.

Figure 9:
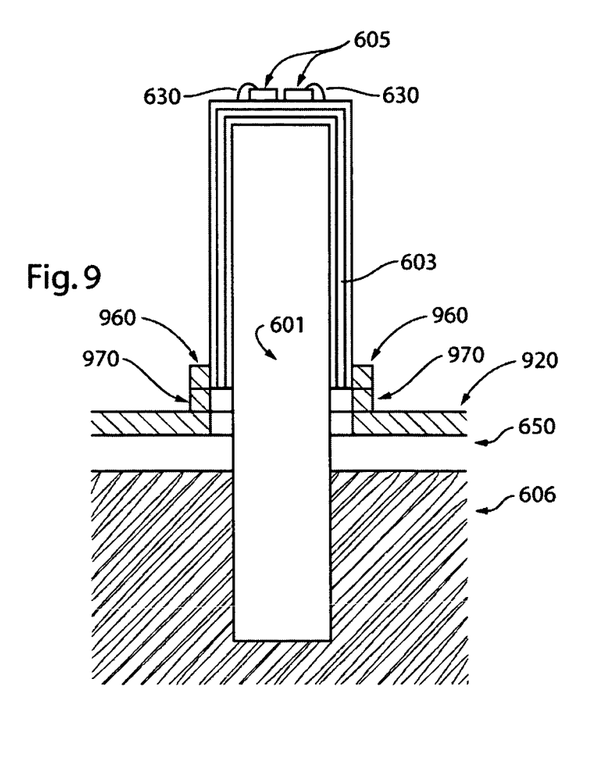
FIG. 9 illustrates a cross sectional view of a thermally and electrically conductive apparatus according to another embodiment of the present invention, wherein a connector provides a means for coupling the thermally and electrically conductive apparatus to a support structure.

In one embodiment as illustrated in FIG. 9, the thermally and electrically conductive apparatus comprises an electrical connector 960 mounted to it that can matingly connect to an electrical connector 970 mount on a circuit carrier 920 or multilayer coating system that is associated with the support structure.

The degree to which the thermally and electrically conductive apparatus is encapsulated or inserted into a support structure which can include for example a heat dissipation system can vary across embodiments of the invention. For example as illustrated by FIGS. 3a and 3c the thermally and electrically conductive apparatus can be almost fully embedded within a support structure.

In one embodiment, the one or more electronic devices can be mounted directly to the surface of a thermally conductive element, as illustrated in FIGS. 1a and 2a, thereby providing substantially low thermal resistance to heat transfer between the electronic device and the thermally conductive element. In this configuration, the thermally conductive element may be electrically conductive and therefore the portion of the thermally and electrically conductive apparatus that is within or in contact with the support structure can be coated with an electrically insulating layer in order to avoid electrical connectivity between the thermally conductive element and the support structure. An example of this configuration of the apparatus is illustrated in FIG. 2a Additional electronic devices 210 or electrical components can be mounted either directly to the thermally conductive element or mounted such that they are electrically insulated from the thermally conductive element.

In another embodiment, the one or more electronic devices are electrically insulated from the thermally conductive element by an electrically insulating layer of the multilayer coating system, as illustrated in FIGS. 3a, 4a, 5a and 6a. The electrically insulating layer or layers separating the electronic devices from the thermally conductive element may be optimized for minimal thermal resistance. The electrically insulating layer may or may not extend into the region that is in contact with the support structure as illustrated in FIGS. 2a and 5a, respectively. In the configuration illustrated in FIG. 2a, the thermally conductive element can be electrically active as an electrically insulating layer of the multilayer coating system can be provided between the thermally conductive element and the support structure.

With reference to FIG. 1a an embodiment of the present invention is illustrated having particular regard to the cross sectional region wherein a thermally conductive element 101 is in contact with a support structure 106, which can include for example a heat dissipation system. The thermally conductive element is surrounded by a multilayer coating system of alternating electrically conductive 103 and electrically insulating layers 102 and 104. The numbers and sequences of layers of the multilayer coating system can be different from the ones illustrated and can be dependent on the desired functionality of the multilayer coating system. One or more electronic devices 105 are in contact with the thermally conductive element. The thermally and electrically conductive element can additionally have other electronic devices 110 attached thereto.

Another embodiment of the present invention is illustrated in FIGS. 2a and 2b where electronic devices 205, for example light-emitting elements, are bonded to and are in contact with one end of the thermally conductive element 201. Connection from the electronic devices to the electrical traces can be achieved through wire bonding 230 or other techniques known to those skilled in the art. It is understood that one or more of the electronic devices can present all electrical leads in such a way that conventional solder processes or epoxy processes can be utilized to electrically connect the one or more electronic devices to designated pads and or traces associated with the thermally and electrically conductive apparatus. The second end of the thermally conductive element is surrounded by a layer 202 of material or a compound that provides a set of predetermined functionalities. These functionalities can include but are not limited to electrically insulating the thermally conductive element from the support structure 206 and increasing the interface surface area between the thermally conductive element and the support structure, which can comprise a heat dissipation system. In one embodiment, the thermally conductive element itself can be used to provide a path for the supply of electric current to the electronic devices. Embedded in the multilayer system can be traces 220 or vias (not shown) that provide paths for the supply of electrical energy to the electronic devices individually or in groups. Furthermore, additional electronic devices 210 may be connected to the apparatus as required.

Figure 3B:
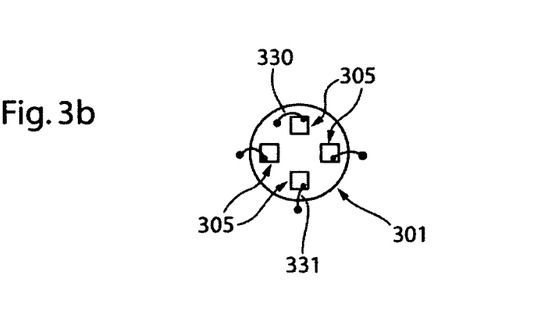
Figure 3C:
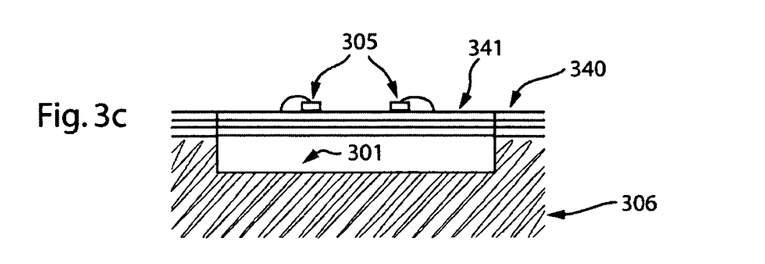
FIG. 3c illustrates a cross sectional view of a thermally and electrically conductive apparatus according to another embodiment of the present invention, wherein the thermally conductive element is embedded in a support structure for example a heat dissipation system.
Figure 3D:
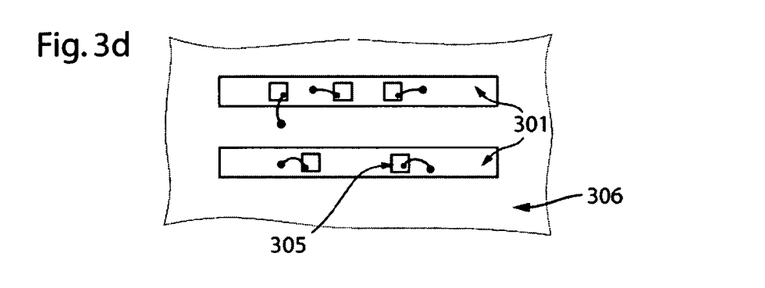
FIG. 3d illustrates a top view of the embodiment according to FIG. 3c.

In another embodiment of the invention as illustrated in FIGS. 3a and 3b, the thermally conductive element 301 can be fully embedded in the support structure 306, which can include a heat dissipation system such that part of one end of the thermally conductive element is available for mounting electronic devices 305 thereto via the multilayer coating system 341. The thermally conductive element can also be embedded into the support structure 306 such that one side of the thermally conductive element is available for mounting electronic components as illustrated in FIGS. 3c and 3d. It is understood that in this configuration, the thermally conductive element can be straight or bent into any shape in the plane of the surface of the support structure, wherein this geometric configuration of the thermally conductive element can be dependent on the requirements of the thermally and electrically conductive apparatus.

Furthermore, the support structure 306 can comprise a circuit carrier 340 in the form of a PCB board or a multilayer coating system, for example. The thermally and electrically conductive apparatus may be removably and reusably connected to the support structure. In this embodiment, the electronic devices may need an enhanced heat sink capability that can be provided by this configuration of the interconnection between the thermally conductive element and the support structure which can comprise a heat dissipation system. The electronic devices can be connected to the circuit carrier provided on the support structure in various ways for example, directly wirebonding 331 or indirectly by mating of appropriate layers of the multilayer coating system 341 with the circuit carrier 340 wherein an electronic device can be wirebonded to the thermally and electrically conductive apparatus. Other connection techniques would be known to worker skilled in the art. The thermally conductive element can be a detachable module or an integral part of the support structure. Furthermore, the thermally conductive element can be an extension of the support structure, for example.

Additional embodiments of the invention are illustrated in FIGS. 4a, 4b, 5a, and 5b. In the embodiments of FIGS. 4a, 4b, 5a and 5b the thermally conductive element, 401 and 501, and the respective one or more electronic devices, 405 and 505, are separated by a multilayer coating system. The electrically insulating layers can achieve electrical insulation of the thermally conductive element from the active electronic devices while providing a desired thermal conductivity between the electronic devices and the thermally conductive element. As illustrated in FIG. 4a, an electronic device can be electrically coupled to the multilayer coating system or the thermally conductive element through wirebonding and an appropriately designed via, for example. Alternate electrical connections would be readily understood by a worker skilled in the art. The multilayer coating system is fabricated from thermally conductive materials thereby enabling heat to be transferred from the one or more electronic devices to the thermally conductive element. In addition, the thickness of each of the electrically conductive and electrically insulating layers of the multilayer coating system may be designed to improve the thermal contact between the electronic devices and the thermally conductive element. The multilayer coating system can have any number or sequence of electrically insulating and electrically conductive layers such that the electrically conductive layers provide paths for the supply of power and/or communication to the electronic devices. As illustrated in FIGS. 4a and 5a, the thermally and electrically conductive apparatus can be coupled to a support structure 406 or 506, respectively, wherein the support structure can comprise a heat dissipation system.

Figure 5B:
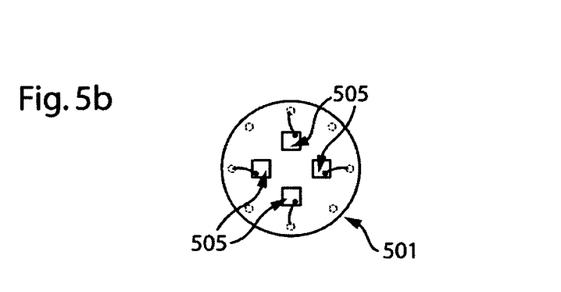
Figure 6B:
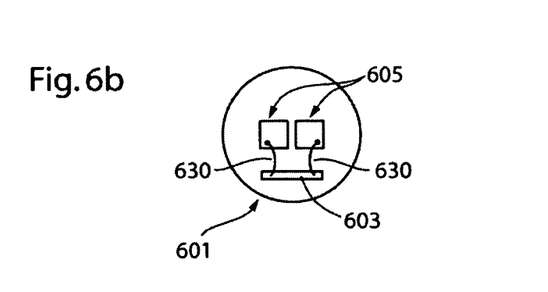

FIGS. 6a and 6b illustrate a variation of the configuration illustrated in FIGS. 5a and 5b, wherein the circuit carrier 620 associated with a support structure 606 may have a separation region 650 therebetween for the placement of additional material layers or support structure components, for example. In this embodiment, the electronic devices 605 can be electrically connected to either the thermally conductive element 601 or a conductive layer 603 of the multilayer coating system though a wirebond 630 to an appropriately designed bond pad 603, for example. A worker skilled in the art would readily understand alternate electrical connection techniques.

Figure 7A:
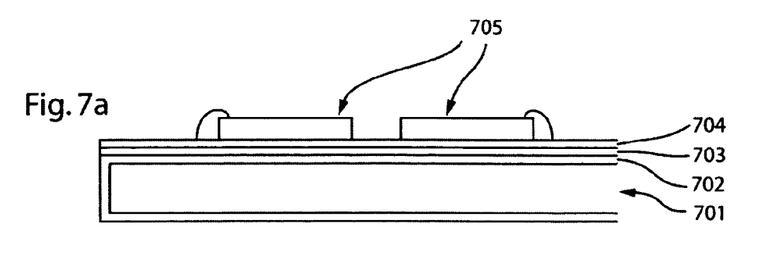
FIG. 7a illustrates a cross sectional view of a thermally and electrically conductive apparatus having a multilayer coating system on one side of a board shaped thermally conductive element according to another embodiment of the present invention, wherein one or more electronic devices are connected to the side of the apparatus.
Figure 7B:
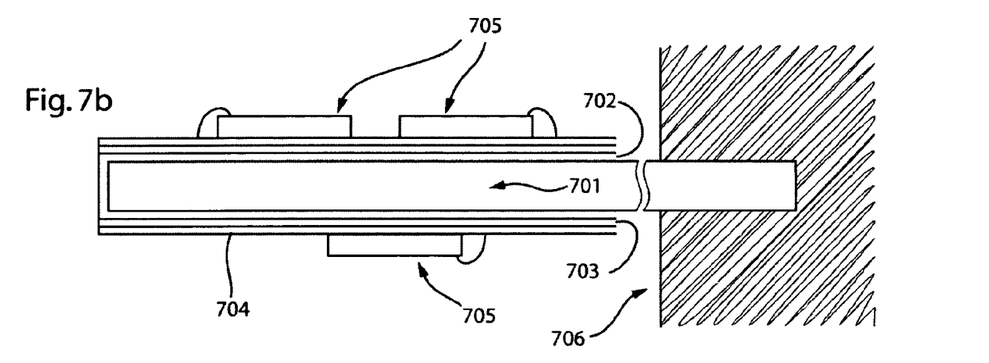
FIG. 7b illustrates a cross sectional view of a thermally and electrically conductive apparatus having a multilayer coating system on both sides of a board shaped thermally conductive element according to another embodiment of the present invention, wherein one or more electronic devices are connected to the side of the apparatus.

With respect to FIGS. 7a and 7b, two more embodiments of the invention are illustrated in which multilayer coating systems comprising appropriate sequences of electrically conductive 703 and electrically insulating layers 702 and 704 are in contact with a flat thermally conductive element 701. Electronic devices 705 and the TCE 701 can be separated by the multilayer coating system or can be in direct contact through specific clearances or attachment points in the multilayer coating system for heat transfer to the thermally conductive element. In addition, electronic devices can be connected to one or both sides of the thermally conductive element for example wherein this can be dependent on the desired functionality. One or a combination of sides or ends of the flat thermally conductive element can be in contact with a heat dissipation system and connected to a structure providing power and communication, for example or alternately, the ends of the thermally conductive element can be coupled to the heat dissipation system.

Figure 7C:
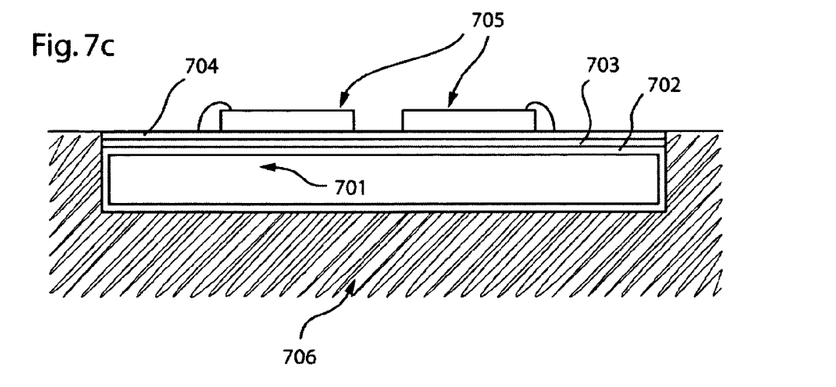
FIG. 7c illustrates a cross sectional view of a thermally and electrically conductive apparatus having a multilayer coating system on a side of a board shaped thermally conductive element that is embedded in a support structure for example a heat dissipation system, according to another embodiment of the present invention.

In another embodiment of the present invention, the thermally conductive element can be embedded within the heat dissipation system as illustrated in FIG. 7c.

Figure 8:
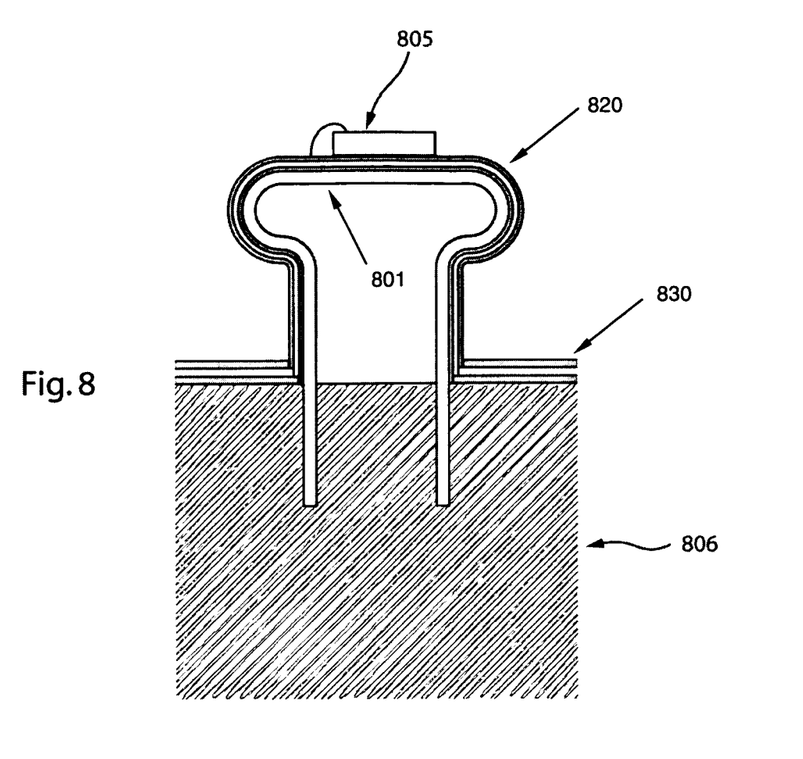
FIG. 8 illustrates a cross sectional view of a shaped thermally and electrically conductive apparatus according to one embodiment of the present invention.

In another embodiment of the invention as illustrated in FIG. 8, a thermally conductive element 801 having a predetermined curvilinear shape is in contact with a support structure 806, which can comprise a heat dissipation system and one or more electronic devices 805. Under operating conditions, heat from the devices can propagate in either direction along the thermally conductive element to the heat dissipation system. In this embodiment, a multilayer coating system 820 is formed on one side of the thermally conductive element and comprises a mating interface connection with a circuit carrier 830 for example a circuit board or multilayer coating system that is associated with the support structure 806. It would be readily understood that the multilayer coating system on the thermally conductive element can cover both sides thereof. In addition, the circuit carrier associate with the support structure can be configured based on the multilayer coating system, for example the circuit carrier may be only provided on one side of the support structure.

FIG. 9 illustrates another embodiment of the present invention, wherein electrical connection of the electronic devices 605 associated with the thermally conductive element 601 to a circuit carrier 920 or multilayer coating system associated with the support structure, can be provided by electrical connectors of the surface mount or thorough hole connector configuration. The format of these types of connectors would be readily understood by a worker skilled in the art. In this embodiment a first connector part 960 is coupled to the thermally and electrically conductive apparatus and can be removably and reusably coupled to a mating second connector part 970, which is coupled to the circuit carrier 920. In one embodiment, in addition to providing electrical contact, these connectors can also provide mechanical mounting features, for example as is provided by snap-on connectors. As would be readily understood, the connector can be mounted at a desired location on the thermally and electrically conductive apparatus or can cover part of the entire outer perimeter of the thermally and electrically conductive apparatus. Furthermore, multiple forms of these connectors can be used.

As illustrated in the Figures, the sizes of layers or regions are exaggerated for illustrative purposes and, thus, are provided to illustrate the general structures of the present invention. Once again, as stated previously, various aspects of the present invention are described with reference to a layer or structure being formed. As will be appreciated by those of skill in the art, references to a layer being formed "on" another layer or a thermally conductive element contemplates that additional layers may intervene. Furthermore, relative terms such as beneath may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation.

It would be readily understood by a worker skilled in the art that while the Figures illustrate a particular number of layers, each of these identified layers can be formed by a plurality of layers depending on the targeted application or optionally there may be fewer layers within the structure.

It is obvious that the foregoing embodiments of the invention are exemplary and can be varied in many ways. Such present or future variations are not to be regarded as a departure from the spirit and scope of the invention, and all such modifications as would be obvious to one skilled in the art are intended to be included within the scope of the following claims.

I claim:

1. A thermally and electrically conductive apparatus, the apparatus comprising:
   a) a thermally conductive element comprising a first end portion and a second end portion opposite the first end portion, wherein the first end portion of the thermally conductive element is in thermal contact with one or more electronic devices, and wherein the second end portion is embedded within a support structure; and
   b) a multilayer coating system comprising three or more layers, said three or more layers being a sequence of electrically insulating and electrically conductive layers, said electrically conductive layers providing one or more paths for supplying electric current to the one or more electronic devices;
   wherein the three or more layers are integrally formed on, and surround, a portion of the thermally conductive element, and extend from the first end portion toward the second end portion.

2. The thermally and electrically conductive apparatus according to claim 1, wherein one or more of the layers of the multilayer coating system include circuit traces for connection of the one or more electronic devices thereto, thereby providing a means for controlling the one or more electronic devices individually or in one or more groups of electronic devices.

3. The thermally and electrically conductive apparatus according to claim 1, wherein the thermally conductive element is electrically conductive, comprising a path for supplying electric current to the one or more electronic devices.

4. The thermally and electrically conductive apparatus according to claim 1, wherein one or more of the three or more layers of the multilayer coating system are formed by deposition.

5. The thermally and electrically conductive apparatus according to claim 1, wherein the support structure comprises a circuit carrier.

6. The thermally and electrically conductive apparatus according to claim 5, wherein the multilayer coating system matingly connects with the circuit carrier and comprises one or more electrical connections between the support structure and the thermally and electrically conductive apparatus.

7. The thermally and electrically conductive apparatus according to claim 6, wherein the thermally and electrically conductive apparatus is permanently connected to the support structure.

8. The thermally and electrically conductive apparatus according to claim 6, wherein the thermally and electrically conductive apparatus is removably connected to the support structure.

9. The thermally and electrically conductive apparatus according to claim 5, wherein the support structure includes a heat dissipation system.

10. The thermally and electrically conductive apparatus according to claim 1, wherein the multilayer coating system sheaths at least a portion of the thermally conductive element.

11. The thermally and electrically conductive apparatus according to claim 1, wherein the thermally conductive element is a passive thermal device selected from the group comprising heat pipe, thermosyphon, microchannel cooler and macrochannel cooler.

12. The thermally and electrically conductive apparatus according to claim 1, wherein the thermally conductive element is an active thermal device selected from the group comprising thermoelectric cooler, thermionic cooler and forced convection cooler.

13. The thermally and electrically conductive apparatus according to claim 1, wherein the thermally conductive element has a shape selected from the group comprising pin, planar element, curved element, cylinder, paraboloid and ellipsoid.

14. The thermally and electrically conductive apparatus according to claim 1, wherein the thermally conductive element has a cross sectional shape selected from the group comprising circular, parabolic, elliptical, prismatic and rectangular.

15. The thermally and electrically conductive apparatus according to claim 1, wherein the thermally conductive element has a curvilinear shape.

\* \* \* \* \*